(12) United States Patent
Sriram et al.

(10) Patent No.: US 8,304,783 B2
(45) Date of Patent: Nov. 6, 2012

(54) SCHOTTKY DIODES INCLUDING POLYSILICON HAVING LOW BARRIER HEIGHTS AND METHODS OF FABRICATING THE SAME

(75) Inventors: Saptharishi Sriram, Cary, NC (US); Qingchun Zhang, Cary, NC (US)

(73) Assignee: Cree, Inc., Durham, NC (US)

( * ) Notice: Subject to any disclaimer, the term of this patent is extended or adjusted under 35 U.S.C. 154(b) by 287 days.

(21) Appl. No.: 12/477,376

(22) Filed: Jun. 3, 2009

(65) Prior Publication Data

US 2010/0308337 A1 Dec. 9, 2010

(51) Int. Cl.
*H01L 29/47* (2006.01)

(52) U.S. Cl. ...... 257/73; 257/77; 257/471; 257/E29.338; 257/E29.104; 257/472

(58) Field of Classification Search .................... None
See application file for complete search history.

(56) References Cited

U.S. PATENT DOCUMENTS

| | | | |
|---|---|---|---|
| 4,897,709 A * | 1/1990 | Yokoyama et al. | 257/301 |
| 4,946,547 A | 8/1990 | Palmour et al. | |
| 5,200,022 A | 4/1993 | Kong et al. | |
| 5,210,051 A | 5/1993 | Carter, Jr. | |
| 5,292,501 A | 3/1994 | Degenhardt et al. | |
| RE34,861 E | 2/1995 | David et al. | |
| 5,393,993 A | 2/1995 | Edmond et al. | |
| 5,523,589 A | 6/1996 | Edmond et al. | |
| 6,218,680 B1 | 4/2001 | Carter, Jr. et al. | |
| 2001/0001075 A1 * | 5/2001 | Ngo et al. | 438/257 |
| 2001/0023105 A1 * | 9/2001 | Yamazaki | 438/289 |
| 2002/0001938 A1 * | 1/2002 | Yamazaki | 438/620 |
| 2002/0004263 A1 * | 1/2002 | Tanabe et al. | 438/199 |
| 2002/0171077 A1 * | 11/2002 | Chu et al. | 257/19 |
| 2002/0187596 A1 * | 12/2002 | Yamanaka et al. | 438/197 |
| 2003/0047752 A1 * | 3/2003 | Campbell et al. | 257/186 |
| 2003/0207480 A1 * | 11/2003 | Kobayashi et al. | 438/22 |
| 2004/0031971 A1 * | 2/2004 | Shimoida et al. | 257/199 |
| 2004/0079989 A1 * | 4/2004 | Kaneko et al. | 257/328 |
| 2004/0202041 A1 * | 10/2004 | Hidenori | 365/233 |
| 2005/0167709 A1 * | 8/2005 | Augusto | 257/292 |
| 2006/0086997 A1 | 4/2006 | Kanaya et al. | |
| 2006/0289960 A1 * | 12/2006 | Wu | 257/458 |
| 2007/0042584 A1 * | 2/2007 | Huang et al. | 438/592 |

(Continued)

FOREIGN PATENT DOCUMENTS

EP 1 503 425 A2 2/2005
EP 1 845 561 A2 10/2007

OTHER PUBLICATIONS

Wolf et al Silicon Processing for the VLSI Era vol. 1—Process Technology Second edition. USA: Lattice Press, 2000.*

(Continued)

*Primary Examiner* — Fei Fei Yeung Lopez
(74) *Attorney, Agent, or Firm* — Myers Bigel Sibley & Sajovec

(57) ABSTRACT

Hybrid semiconductor devices including a PIN diode portion and a Schottky diode portion are provided. The PIN diode portion is provided on a semiconductor substrate and has an anode contact on a first surface of the semiconductor substrate. The Schottky diode portion is also provided on the semiconductor substrate and includes a polysilicon layer on the semiconductor substrate and a ohmic contact on the polysilicon layer. Related Schottky diodes are also provided herein.

16 Claims, 8 Drawing Sheets

U.S. PATENT DOCUMENTS

2007/0145429 A1* 6/2007 Francis et al. ............. 257/260
2008/0090403 A1* 4/2008 Schlangen et al. ............ 438/599
2008/0191304 A1 8/2008 Zhang et al.

OTHER PUBLICATIONS

Chen et al. "Theoretical Analysis of Current Crowding Effect in Metal / AlGaN/ GaN Schottky Diodes and Its Reduction by Using Polysilicon in Anode," Chin. Phys. Lett., vol. 24, No. 7 (2007) pp. 2112-2114.

Notification of Transmittal of the International Search Report and the Written Opinion of the International Searching Authority, or the Declaration, PCT/US2010/028612, Jun. 17, 2010.

Notification of Transmittal of the International Preliminary Report on Patentability, PCT/US2010/028612, Aug. 17, 2011.

* cited by examiner

SCHOTTKY DIODES INCLUDING POLYSILICON HAVING LOW BARRIER HEIGHTS AND METHODS OF FABRICATING THE SAME

STATEMENT OF U.S. GOVERNMENT INTEREST

This invention was made with Government support under ONR/DARPA Contract No. 05-C-0202. The Government has certain rights in the invention.

FIELD OF THE INVENTION

The present invention generally relates to semiconductor devices and, more particularly, to Schottky diodes and methods of fabricating the same.

BACKGROUND

High voltage silicon carbide (SiC) devices can handle voltages above about 600V or more. Such devices may handle as much as about 100 amps or more of current, depending on their active area. High voltage SiC devices have a number of important applications, particularly in the field of power conditioning, distribution and control. High voltage semiconductor devices, such as Schottky diodes, MOSFETs, GTOs, IGBTs, BJTs, etc., have been fabricated using silicon carbide.

Schottky barrier diodes are used extensively as output rectifiers in switching-mode power supplies and in other high-speed power switching applications, such as motor controls, for carrying large forward currents and supporting large reverse blocking voltages. Diodes exhibit low resistance to current flow in a forward direction and a very high resistance to current flow in a reverse direction. A Schottky barrier diode produces rectification as a result of nonlinear unipolar current transport across a metal semiconductor contact.

Silicon carbide (SiC) Schottky diodes are a promising technology because such devices can provide a low forward voltage drop, high breakdown voltage, and fast switching speed with essentially no reverse recovery current. However, the operational characteristics of a Schottky diode can depend heavily on the type of metal used for the Schottky contact. The power dissipated by a Schottky diode depends on the forward voltage drop and the reverse leakage current, both of which should be as low as possible. The forward voltage drop and the reverse leakage current are related to the barrier height of the Schottky contact, i.e., the magnitude of the potential barrier between the metal and semiconductor regions of the Schottky contact.

A low barrier height metal will have a low forward voltage drop and a large reverse leakage current. Conversely, a high barrier height metal will have a larger forward voltage drop and a smaller reverse leakage current. Therefore, it is desirable to have a Schottky diode which exhibits the forward characteristics of a small barrier height metal and the reverse characteristics of a large barrier height metal. A trench type Schottky diode can be configured to partially satisfy these conflicting design criteria by using lines of high barrier metals to pinch-off or electrically shield intervening trenched lines of low barrier metals. Although such trench type Schottky diodes may provide improved forward and reverse operational characteristics, their fabrication cost may be increased by the processes needed to form the trenches and high/low barrier metal lines, and their forward and reverse characteristics can be limited by the trench and high/low metal line feature sizes that are obtainable.

SiC PIN diodes are very attractive for RF limiter applications. In particular, the high breakdown strength and high thermal conductivity of SiC may enable much higher RF power levels and faster switching speeds than may have been possible using silicon (Si) or gallium arsenide (GaAs) technologies. In these applications, a Schottky diode is commonly used to rectify the RF signal and produce a bias current for the PIN diode, which will limit the RF signal to acceptable levels. The barrier height of the Schottky diode used in these applications should be relatively low to rectify low-level RF signals. Many applications require a barrier height of 0.5 eV or less. However, most commonly used materials, such as chromium (Cr) and Titanium (Ti) only provide barrier heights of about 0.8 eV or higher on SiC.

SUMMARY

Some embodiments of the present invention provide hybrid semiconductor devices including a PIN diode portion and a Schottky diode portion. The PIN diode portion is provided on a semiconductor substrate and has an anode contact on a first surface of the semiconductor substrate. The Schottky diode portion is also provided on the semiconductor substrate and includes a polysilicon layer on the semiconductor substrate and the polysilicon layer acts as a Schottky contact.

In further embodiments of the present invention, the semiconductor substrate may include Gallium Nitride (GaN).

In still further embodiments of the present invention, the semiconductor substrate may include silicon carbide (SiC). In certain embodiments, the SiC substrate may be a semi-insulating SiC substrate.

In some embodiments of the present invention, the polysilicon layer may be an N-type polysilicon layer.

In further embodiments of the present invention, a SiC layer may be provided on the SiC substrate. A P-type SiC layer may be provided on the SiC layer. The SiC layer and the P-type SiC layer may define a trench that extends through the P-type SiC layer and exposes the SiC layer. The polysilicon layer may be on the exposed portion of the SiC layer. The ohmic contact may be on the polysilicon layer and the anode contact of the PIN diode portion may be on the P-type SiC layer. The SiC layer may be insulating SiC layer.

In still further embodiments of the present invention, the anode contact of the PIN diode portion may be an ohmic contact including aluminum, titanium and/or nickel.

In some embodiments of the present invention, the trench may be a first trench. An N-type SiC layer may be provided on the SiC substrate between the SiC substrate and the SiC layer. The SiC layer and the N-type SiC layer may define a second trench that extends through the SiC layer and exposes the N-type SiC layer. An ohmic contact may be provided on the exposed portion of the N-type SiC layer.

In further embodiments of the present invention, the device may have a barrier height of less than about 0.8 eV to about 0.3 eV.

In still further embodiments of the present invention, the device may be stable at operating temperatures up to about 250° C.

Some embodiments of the present invention provide Schottky diodes including a drift layer on a first surface of a semiconductor substrate, a polysilicon layer on the drift layer and an anode contact on the poly-silicon layer.

In further embodiments of the present invention, the drift layer may include a silicon carbide (SiC) drift layer and the semiconductor substrate may be a SiC substrate.

In still further embodiments of the present invention, the polysilicon layer may be an N-type polysilicon layer. A cathode contact may be provided on a second surface of the semiconductor substrate, opposite the first surface of the substrate. In certain embodiments, the diode may be a junction barrier Schottky (JBS) diode. In these embodiments, the diode may further include a plurality P-type regions in the SiC drift layer. The anode contact may form a Schottky junction with the exposed portions of the SiC drift layer and an ohmic contact with the plurality of P-type regions.

In some embodiments of the present invention, the drift layer may be a layer including gallium nitride (GaN) and the semiconductor substrate may be a GaN substrate. The diode may further include a cathode contact on the layer including GaN that is spaced apart from the polysilicon layer and the anode contact.

In further embodiments of the present invention, the layer including GaN may include aluminum gallium nitride (AlGaN).

Still further embodiments of the present invention provide a Schottky diode including a drift layer on a first surface of a semiconductor substrate; a barrier layer on the drift layer; and an anode contact on the barrier layer. The barrier layer provides a diode having a barrier height of from about 0.2 eV to about 0.8 eV. The barrier height may be 0.5 eV or less, 0.4 eV or less, 0.3 eV or less or from about 0.2 eV about 0.5 eV.

Although embodiments of the present invention are primarily discussed above with respect to device embodiments, related methods of fabricating these devices are also provided herein.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
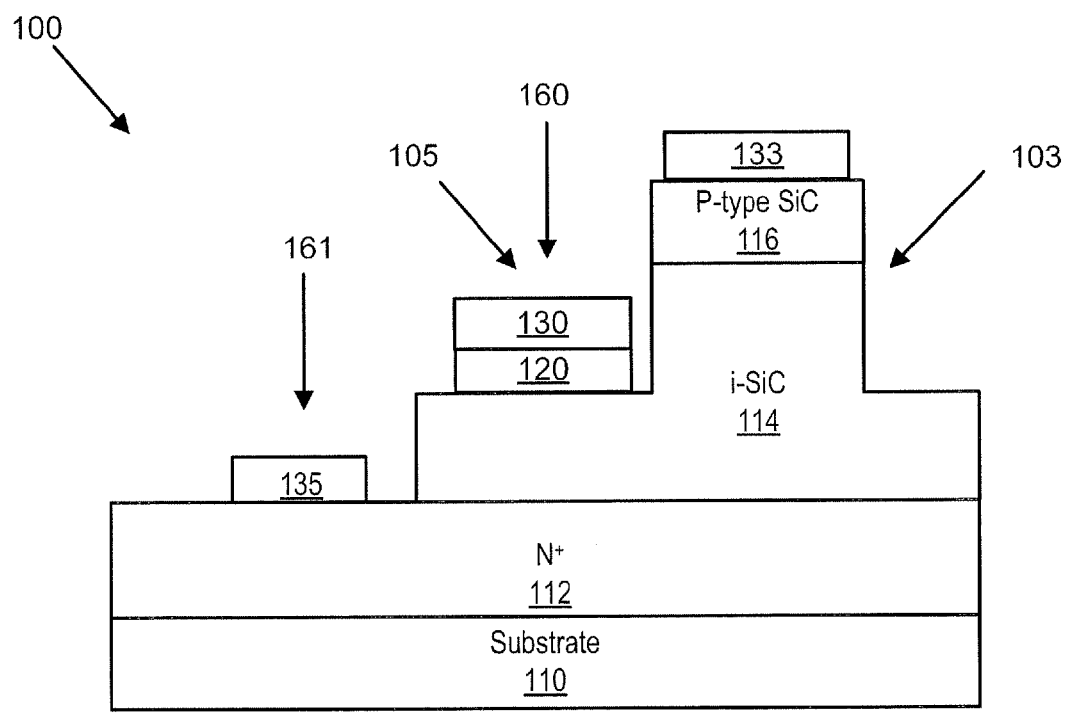
FIG. 1 is a cross section illustrating a hybrid semiconductor device in accordance with some embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below," "above," "upper," "lower," "horizontal," "lateral," "vertical," "beneath," "over," etc., may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as N-type or P-type, which refers to the majority carrier concentration in the layer and/or region. Thus, N-type material has a majority equilibrium concentration of negatively charged electrons, while P-type material has a majority equilibrium concentration of positively charged holes. Some material may be designated with a "+" or "−" (as in $n^+$, $n^-$, $p^+$, $p^-$, $n^{++}$, $n^{--}$, $p^{++}$, $p^{--}$, or the like), to indicate a relatively larger ("+") or smaller ("−") concentration of majority carriers compared to another layer or region. However, such notation does not imply the existence of a particular concentration of majority or minority carriers in a layer or region.

As discussed above, SiC PIN diodes are very attractive for RF limiter applications. In particular, the high breakdown strength and high thermal conductivity of SiC may enable much higher RF power levels and faster switching speeds than may have been possible using silicon (Si) or gallium arsenide (GaAs) technologies. In these applications, a Schottky diode is commonly used to rectify the RF signal and produce a bias current for the PIN diode, which will limit the RF signal to acceptable levels. The barrier height of the Schottky diode used in these applications should be relatively low to rectify low-level RF signals. Many applications require a barrier height of 0.5 eV or less. However, most commonly used materials, such as chromium (Cr) and Titanium (Ti) only provide barrier heights of about 0.8 eV or higher on SiC. Barrier heights of 0.8 eV may only detect larger signals. Accordingly, there is a need for devices that can detect relatively smaller signals on sic.

Thus, according to some embodiments of the present invention, RF diodes are provided that have the capability of detecting smaller signals on SiC. In particular, as will be discussed further herein, devices in accordance to some embodiments of the present invention may have barrier heights significantly less than 0.8 eV. For example, in some embodiments, the barrier height may be 0.5 eV or less. In some embodiments, the barrier height may be 0.4 eV or less, 0.3 eV or less, or from about 0.2 eV to about 0.5 eV without departing from the scope of the present invention. In some embodiments of the present invention, these RF diodes include N-type polysilicon in a Schottky diode on SiC. Devices in accordance with some embodiments of the present invention may provide RF diodes having low barrier heights, robust device performance due to the polysilicon contact on SiC, improved avalanche capability and high temperature capability as will be discussed further herein with respect to FIGS. 1 through 7.

Exemplary embodiments of the present invention will now be discussed with respect to FIGS. 1 through 7. Referring first to FIG. 1, a hybrid semiconductor device 100 in accordance with some embodiments of the present invention will be discussed. As illustrated in FIG. 1, an $N^+$ drift layer 112 is provided on a substrate 110. The substrate 110 may be a semi-insulating silicon carbide (SiC) substrate, that may be, for example, the 4H polytype of silicon carbide. Other silicon carbide candidate polytypes may include the 3C, 6H, and 15R polytypes. The term "semi-insulating" is used descriptively herein, rather than in an absolute sense. In some embodiments of the present invention, the silicon carbide bulk crystal may have a resistivity equal to or higher than about $1\times10^5$ Ω-cm at room temperature.

Silicon carbide has a much closer crystal lattice match to Group III nitrides than does sapphire ($Al_2O_3$), which may be a common substrate material for Group III nitride devices. The closer lattice match may result in Group III nitride films of higher quality than those generally available on sapphire. Silicon carbide also has a relatively high thermal conductivity, and as such, the total output power of Group III nitride devices formed on silicon carbide may not be as limited by thermal dissipation of the substrate as similar devices formed on sapphire and/or silicon. Also, semi-insulating silicon carbide substrates may provide for device isolation and reduced parasitic capacitance. Exemplary SiC substrates that may be used in some embodiments of the present invention are manufactured by, for example, Cree, Inc., of Durham, N.C., the assignee of the present invention, and methods for producing such substrates are described, for example, in U.S. Pat. Nos. Re. 34,861; 4,946,547; 5,200,022; and 6,218,680, the disclosures of which are incorporated by reference herein in their entireties. Similarly, techniques for epitaxial growth of Group III nitrides have been described in, for example, U.S. Pat. Nos. 5,210,051; 5,393,993; 5,523,589; and 5,292,501, the disclosures of which are also incorporated by reference herein in their entireties.

The $N^+$ drift layer 112 may be an $N^+$ SiC layer having a thickness of from about 0.1 μm to about 10 μm. The $N^+$ drift layer 112 may have a carrier concentration of from about $1.0\times10^{14}$ cm$^{-3}$ to about $5.0\times10^{17}$ cm$^{-3}$. As further illustrated in FIG. 1, an insulating SiC layer (i-SiC) 114 is formed on the $N^+$ drift layer 112. In some embodiments of the present invention, the insulating SiC layer 114 may be lightly doped, for example, less then about $5.0\times10^{14}$ cm$^{-3}$. In some embodiments of the present invention, insulating SiC layer 114 may be doped with, for example, Vanadium (V) or Iron (Fe). The insulating SiC layer 114 may have a thickness of from about 0.1 μm to about 10 μm.

A P-type SiC layer 116 is provided on the insulating SiC layer 114. The P-type SiC layer 116 may include 6H, 4H, 15R or 3C polytype silicon carbide. In some embodiments, the P-type SiC layer is a $P^+$ SiC layer having a carrier concentration of from about $1.0\times10^{18}$ cm$^{-3}$ to about $1.0\times10^{20}$ cm$^{-3}$. Suitable dopants include aluminum (Al), boron (B) and/or gallium (Ga). The P-type SiC layer 116 may have a thickness of from about 0.1 μm to about 2.0 μm. A P-type ohmic contact 133 including Al, Titanium (T) and/or Nickel (N) is provided on the P-type SiC layer 116 and completes the PIN diode portion 103 of the hybrid device 100.

As further illustrated in FIG. 1, the insulating SiC layer 114 and the P-type SiC layer 116 define first and second trenches 160 and 161. In particular, the first trench extends through the P-type SiC layer 116 and into the insulating SiC layer 114 from about 0.1 μm to about 5 μm exposing a surface of the insulating SiC layer 114. A polysilicon layer 120 is provided on the exposed portion of the insulating SiC layer. In some embodiments, the polysilicon layer 120 may be $N^+$ polysilicon. A Schottky diode portion 105 is completed by providing a contact 130 on the polysilicon layer 120. A Schottky contact is formed between the polysilicon layer 120 and the insulating SiC layer 114. The contact 130 can be any suitable Schottky metal, such as nickel (Ni), Titanium (Ti), Aluminum (Al) and Tungsten (W) without departing from the scope of the present invention.

The second trench extends through the P-type SiC layer 116 and the insulating SiC layer 114 and exposes a surface of the $N^+$ drift layer 112. An N-type ohmic contact 135 is formed on the exposed surface of the $N^+$ drift layer 112. The N-type ohmic contact may include, for example, Ni or polysilicon. Passive components of the device may be formed to complete the device using methods known to those having skill in the art and, therefore, details thereof will not be discussed further herein.

As discussed above, the presence of the polysilicon layer 120 in the Schottky portion 105 of the device may provide RF diodes that have the capability of detecting smaller signals on SiC. In particular, hybrid devices in accordance with some embodiments of the present invention may have barrier heights significantly less than 0.8 eV, for example, 0.5 eV or less. As discussed above, some embodiments of the present invention provide RF diodes including N-type polysilicon in a Schottky diode portion of the device on SiC. Devices in accordance with some embodiments of the present invention may provide RF diodes having low barrier heights, robust device performance due to the polysilicon contact on SiC, improved avalanche capability and high temperature capability.

Figure 2:
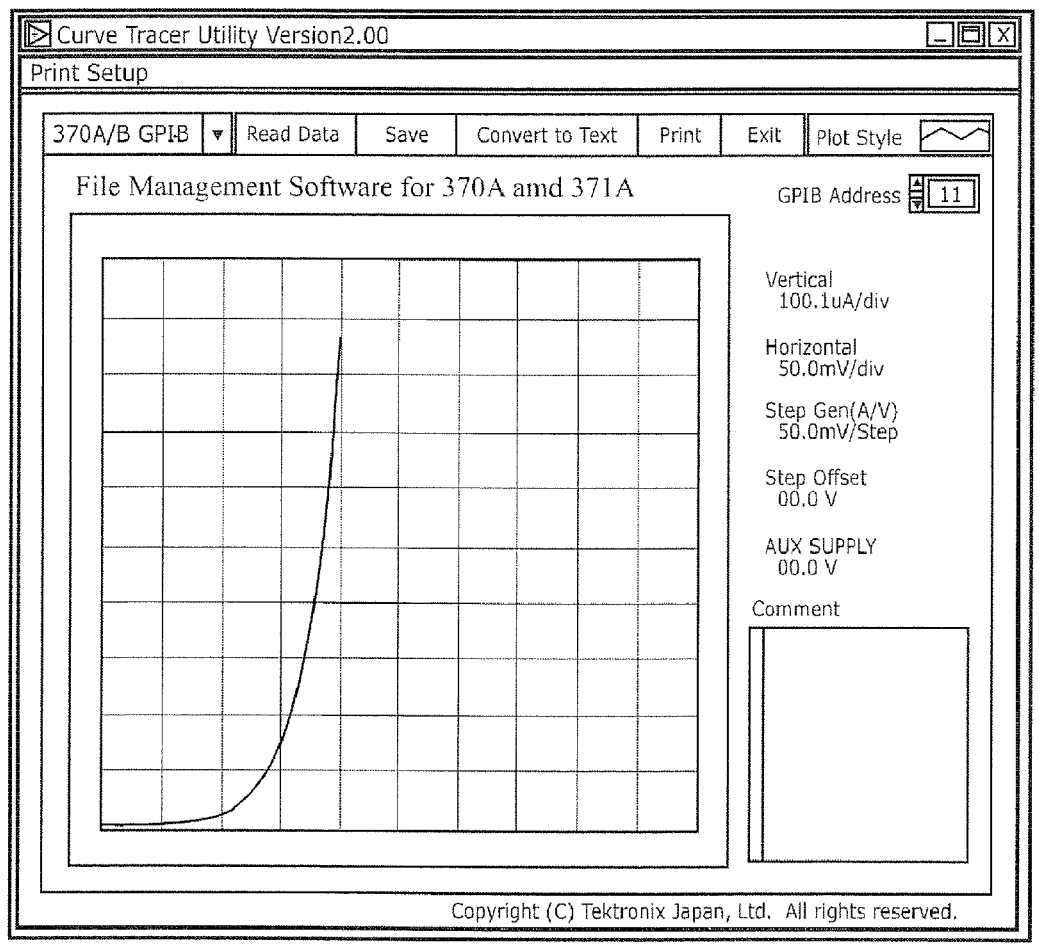
FIGS. 2 and 3 are graphs illustrating performance characteristics of hybrid devices in accordance with some embodiments of the present invention.
Figure 3:
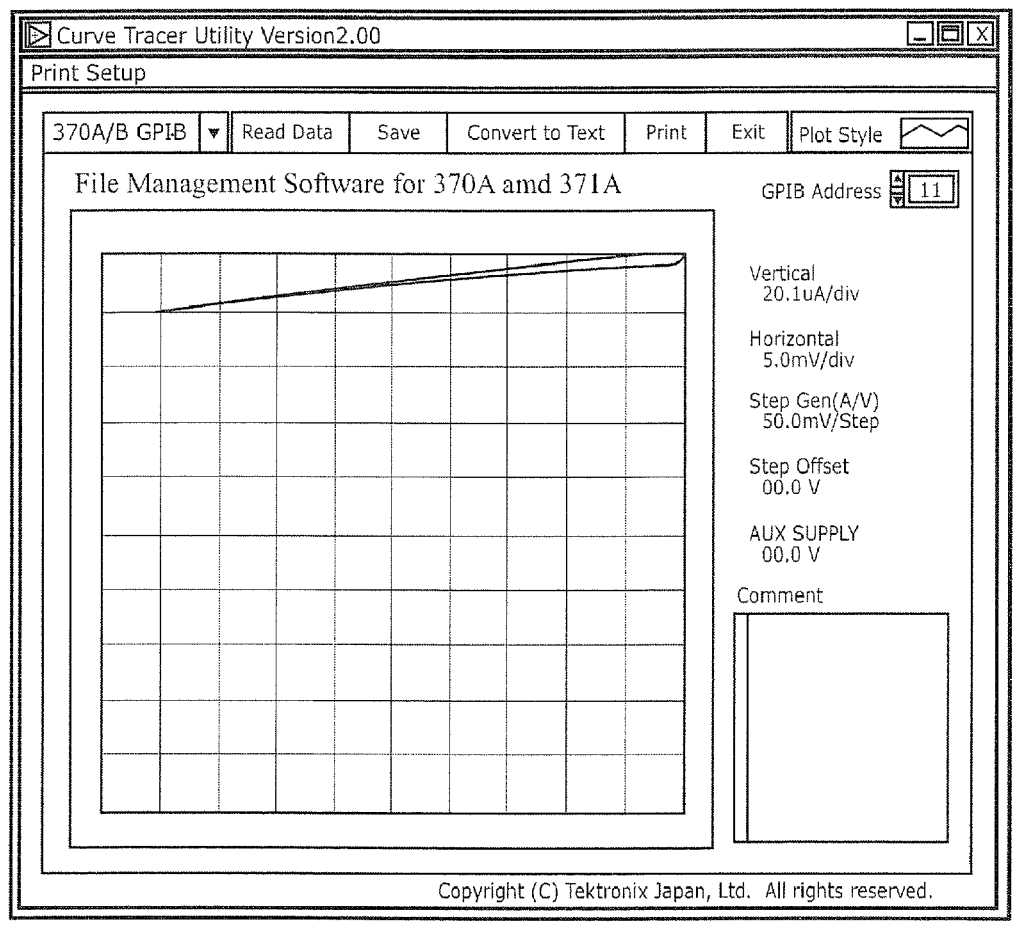

Exemplary forward and reverse IV characteristics for hybrid semiconductor devices in accordance with some embodiments of the present invention are illustrated in FIGS. 2 and 3. In particular, FIG. 2 is a graph illustrating forward IV characteristics of $N^+$ polysilicon SiC Schottky diodes in accordance with some embodiments of the present invention. A voltage as low as 50 mV has been achieved which indicates a low Schottky barrier height. Similarly, FIG. 3 is a graph illustrating reverse IV characteristics of $n^+$ polysilicon SiC Schottky diodes in accordance with some embodiments of the present invention. A blocking voltage of greater than about 40V was demonstrated with a low leakage current.

Figure 4A:
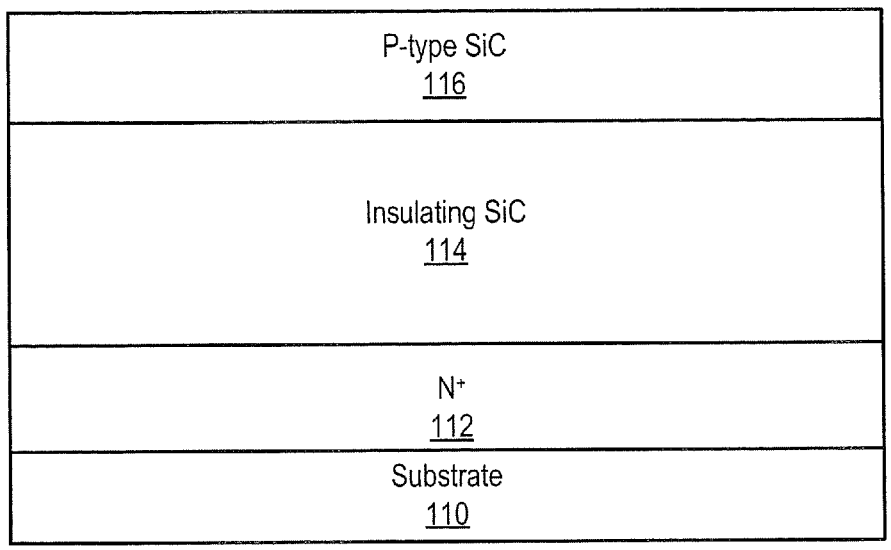
FIGS. 4A through 4F are cross sections illustrating processing steps in the fabrication of hybrid semiconductor devices in accordance with some embodiments of the present invention.

Referring now to FIGS. 4A to 4E, processing steps in the fabrication of hybrid semiconductor devices in accordance with some embodiments of the present invention will be discussed. Referring first to FIG. 4A, an $N^+$ drift layer 112 is formed on a substrate 110. The substrate 110 may be a semi-insulating silicon carbide (SiC) substrate, that may be, for example, the 4H polytype of silicon carbide. Other silicon carbide candidate polytypes may include the 3C, 6H, and 15R polytypes. The term "semi-insulating" is used descriptively herein, rather than in an absolute sense. In some embodiments of the present invention, the silicon carbide bulk crystal may have a resistivity equal to or higher than about $1\times10^5$ Ω-cm at room temperature.

The $N^+$ drift layer 112 may be an $N^+$ SiC layer and may be formed to have a thickness of from about 0.1 μm to about 10 μm. The $N^+$ drift layer 112 may be doped to have a carrier concentration of from about $1.0\times10^{14}$ cm$^{-3}$ to about $5.0\times10^{17}$ cm$^{-3}$. As further illustrated in FIG. 1, insulating SiC layer (i-SiC) 114 is formed on the $N^+$ drift layer 112. In some embodiments of the present invention, insulating SiC layer 114 may be doped with, for example, Vanadium (V) or Iron (Fe). The insulating SiC layer 114 may be formed to have a thickness of from about 0.1 μm to about 10 μm.

A P-type SiC layer 116 is formed on the insulating SiC layer 114. The P-type SiC layer 116 may include 6H, 4H, 15R or 3C polytype silicon carbide. In some embodiments, the P-type SiC layer is $P^+$ SiC layer having a carrier concentration of from about $1.0\times10^{10}$ cm$^{-3}$ to about $1.0\times10^{20}$ cm$^{-3}$. Suitable dopants include aluminum (Al), boron (B) and/or gallium (Ga). The P-type SiC layer 116 may have a thickness of from about 0.1 μm to about 2 μm. In some embodiments, the insulating SiC layer 114 may be lightly doped, for example, less than about $5.0\times10^{14}$ cm$^{-3}$, n-type or p-type.

Figure 4B:
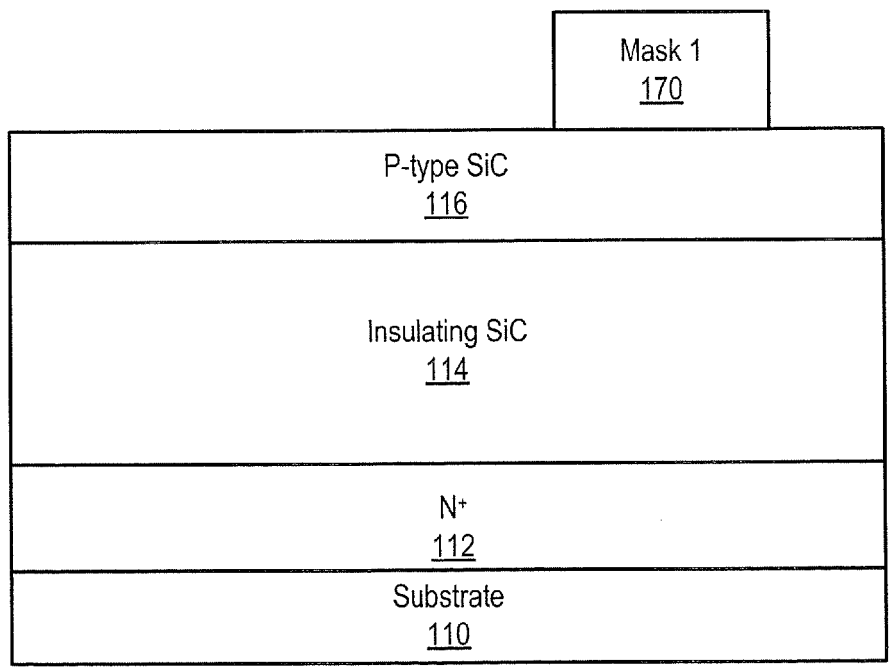
Figure 4C:
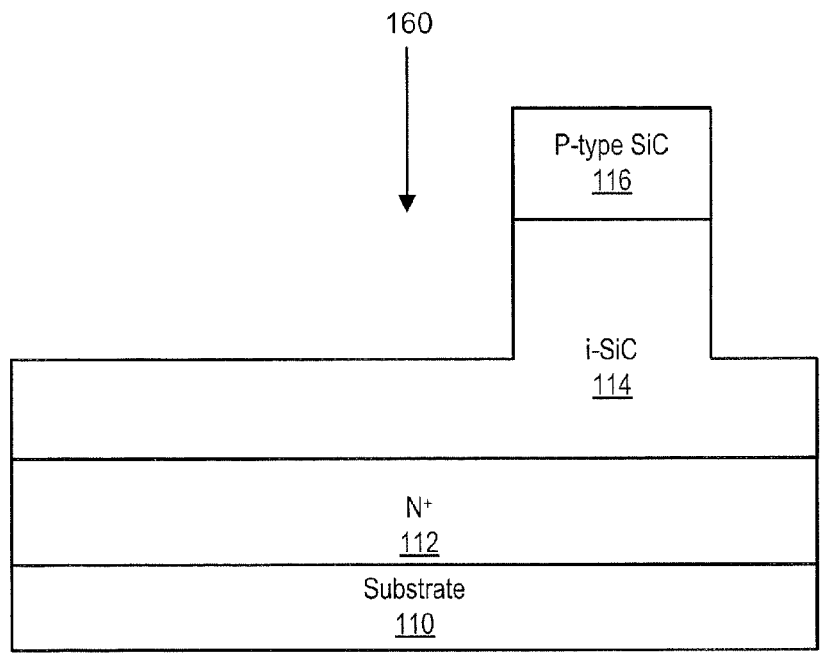

Referring now to FIG. 4B, a mask 170 is formed on the P-type SiC layer 116. The P-type SiC layer 116 and the insulating SiC layer 114 may be patterned and etched using the mask 170. The mask 170 may include a photoresist and/or a metal, and may be patterned using conventional photolithographic/liftoff techniques without departing from the scope of the present invention. In particular, the P-type SiC layer 116 and the insulating SiC layer 114 are etched to form a first trench 160 as illustrated in FIG. 4C. As illustrated, the trench 160 extends through the P-type SiC layer 116 and into the insulating SiC layer 114 exposing a surface of the insulating SiC layer 114. In some embodiments, the trench 160 may extend from about 0.1 μm to about 5 μm into the insulating SiC layer 114. The etch time may be adjusted such that the process will terminate when the trench 160 has extended into insulating SiC layer 116 in the acceptable range. The mask 170 may be removed.

Figure 4D:
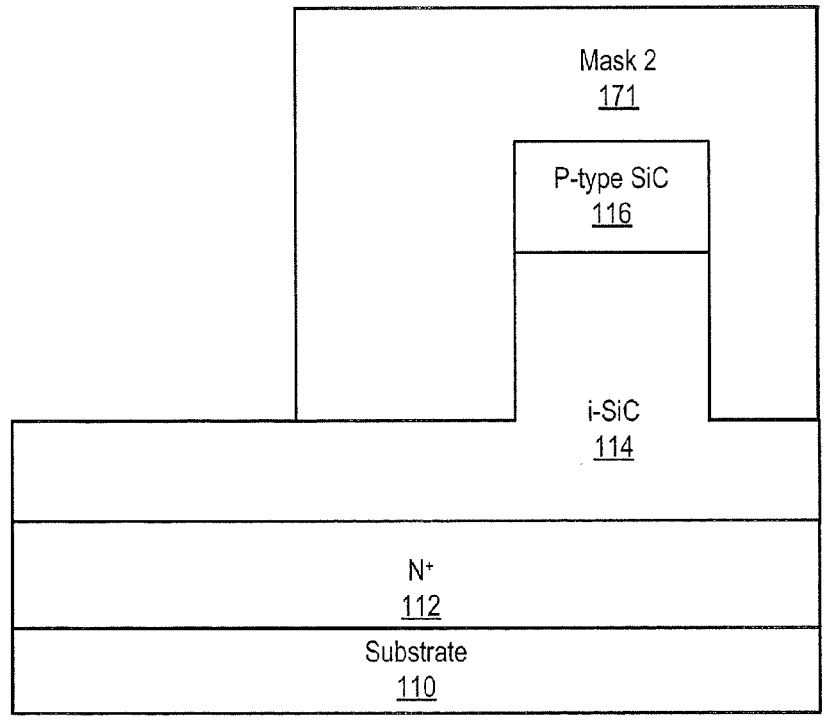
Figure 4E:
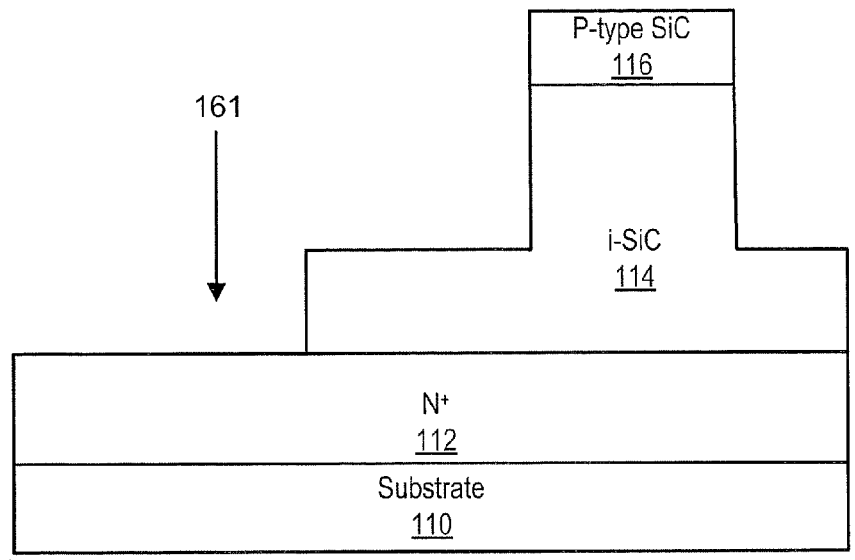

A second mask 171 is formed on the P-type SiC layer 116 and the insulating SiC layer 114 as illustrated in FIG. 4D. The insulating SiC layer 114 and the $N^+$ drift layer 112 may be patterned and etched using the mask 171. The mask 171 may include a photoresist and/or a metal, and may be patterned using conventional photolithographic/liftoff techniques without departing from the scope of the present invention. In particular, the insulating SiC layer 114 and the $N^+$ drift layer 112 may be etched to form the second trench 161 as illustrated in FIG. 4E. As illustrated, the trench 161 extends through the insulating SiC layer 114 exposing a surface of the $N^+$ drift layer 112. In some embodiments, the trench 161 may extend from about 0.1 μm to about 2.0 μm into $N^+$ drift layer 112. The etch time may be adjusted such that the process will terminate when the trench 161 has extended into $N^+$ drift layer 112 in the acceptable range. The mask 171 may be removed.

Figure 4F:
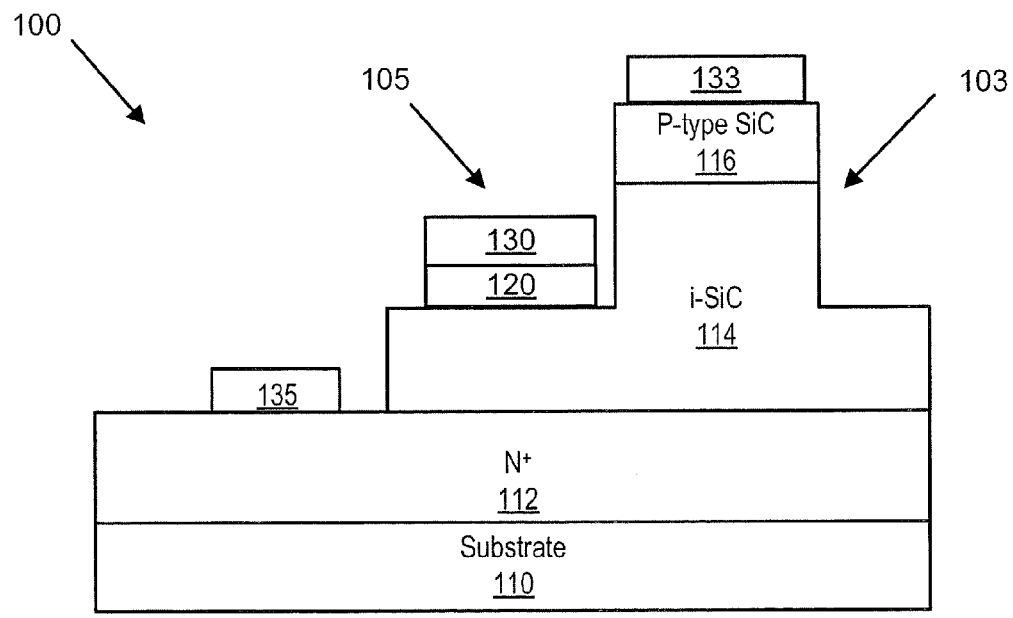

As illustrated in FIG. 4F, contacts may be formed to complete the PIN diode portion 103 and the Schottky diode portion 105 of the hybrid device 100. In particular, metal or polysilicon may be deposited on the $N^+$ drift layer 112 to form an N-type ohmic contact 135 on the exposed surface of the $N^+$ drift layer 112. The N-type ohmic contact 135 may include, for example, Ti, Ni, W or polysilicon. Similarly, metal may be deposited on the P-type SiC layer 116 to form a P-type ohmic contact 133 including Al, T and/or N and completes the PIN diode portion 103 of the hybrid device 100.

As further illustrated in FIG. 4F, a polysilicon layer 120 may be deposited on the exposed portion of the insulating SiC layer 114 using, for example, low-pressure chemical vapor deposition (LPCVD). In some embodiments, the polysilicon layer 540 may be $N^+$ polysilicon. The polysilicon layer 120 may be patterned to remain on the exposed portion of the insulating SiC layer 114 as illustrated in FIG. 4F. Metal is deposited on the polysilicon layer 120 to form an ohmic contact 130 on the polysilicon layer 120. The contact 130 can be any suitable metal, such as Al, Ni, Ti and W without departing from the scope of the present invention. In some embodiments of the present invention, the Schottky contact is non-ohmic. The formation of the contact 130 on the polysilicon layer 120 completes the formation of the Schottky portion 105 of the hybrid device 100.

Passive components of the device may be formed to complete the device using methods known to those having skill in the art and, therefore, details thereof will not be discussed further herein.

As discussed above, the presence of the polysilicon layer 120 in the Schottky portion 105 of the device may provide RF diodes that have the capability of detecting smaller signals on SiC. In particular, hybrid devices in accordance with some embodiments of the present invention may have barrier heights significantly less than 0.8 eV, for example, 0.5 eV or less. As discussed above, some embodiments of the present invention provide RF diodes including N-type polysilicon in a Schottky diode portion of the device on SiC. Devices in accordance with some embodiments of the present invention may provide RF diodes having low barrier heights, robust device performance due to the polysilicon contact on SiC, improved avalanche capability and high temperature capability.

Figure 5:
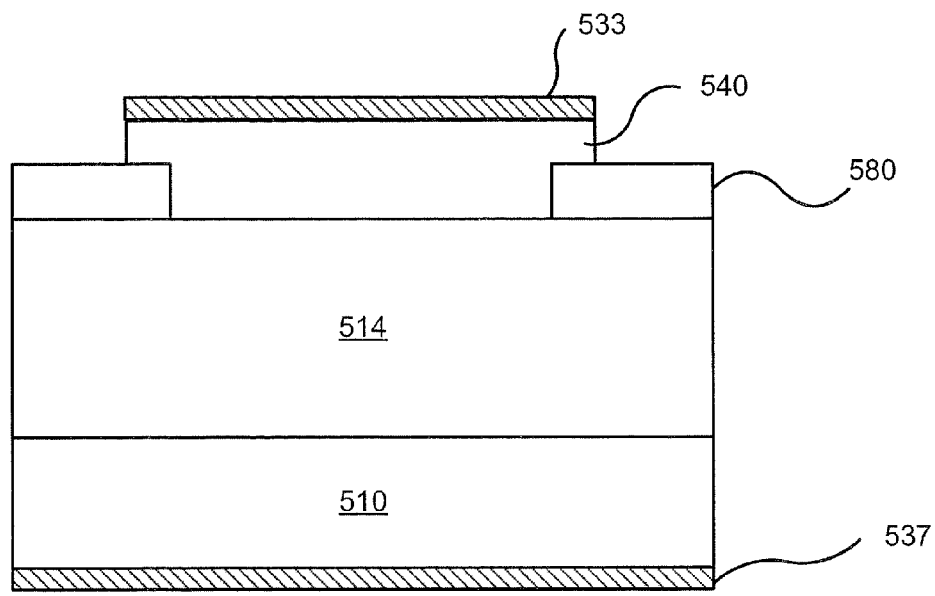
FIGS. 5 through 7 are cross sections illustrating diodes including polysilicon layers in accordance with some embodiments of the present invention.
Figure 6:
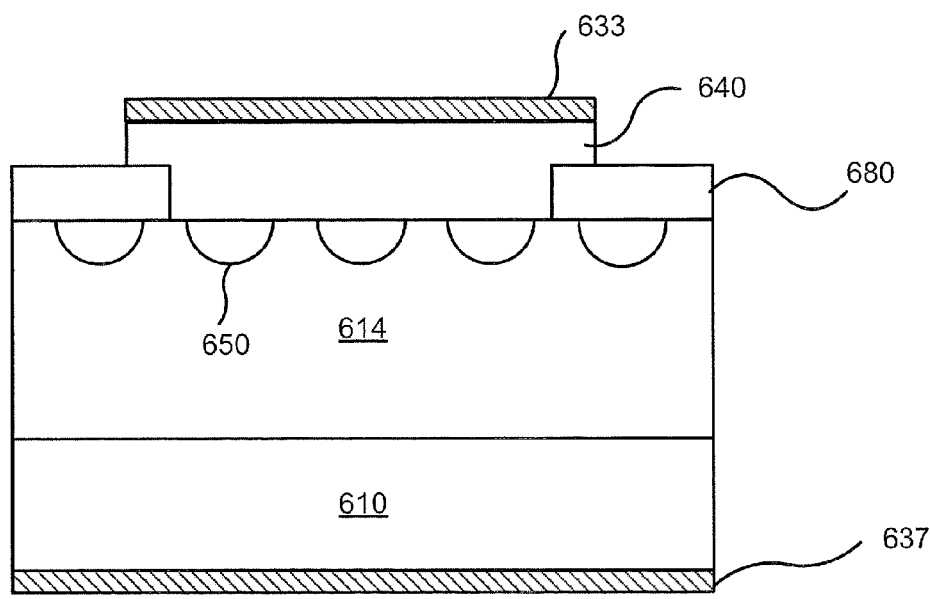
Figure 7:
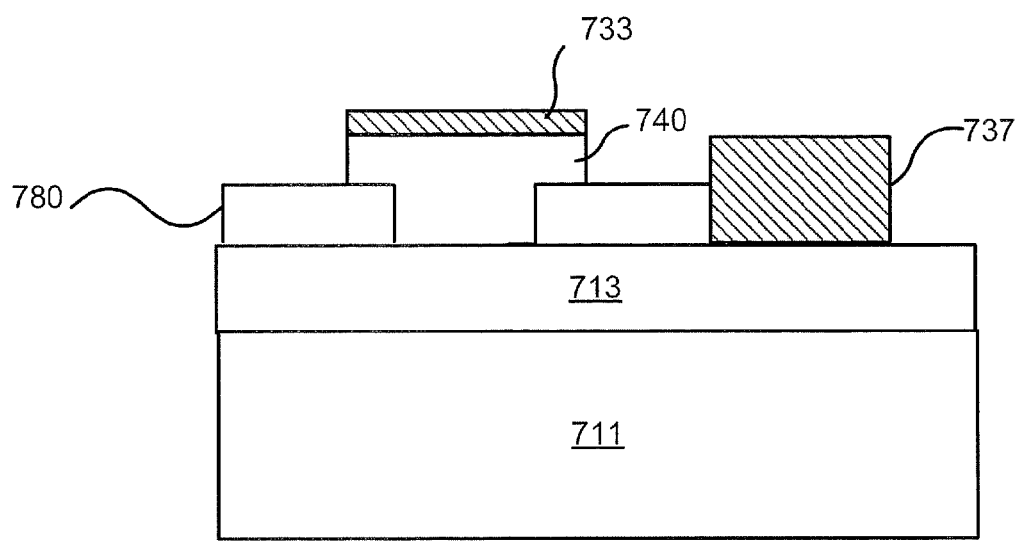

Referring now to FIGS. 5 through 7, embodiments of various Schottky diode structures including polysilicon will be discussed. In particular, embodiments of the present invention discussed above with respect to FIGS. 1 through 4F are directed to a hybrid semiconductor device 100 including both a PiN diode portion and a Schottky diode portion on a shared substrate. It will be understood that embodiments of the present invention are not limited to this configuration. For example, polysilicon may be used in Schottky diodes and may provide similar advantages as those discussed above with respect to the hybrid semiconductor device.

Referring now to FIG. 5, a cross section of a Schottky diode in accordance with some embodiments of the present invention will be discussed. A SiC drift layer 514 is provided on a SiC semiconductor substrate 510. A passivation layer 580 is provided on the SiC drift layer 514. A polysilicon layer 540 is provided in an opening in the passivation layer 580 such that the polysilicon layer is provided on both a surface of the SiC drift layer 514 exposed by the trench and on the passivation layer 580. In some embodiments, the polysilicon layer 540 may be N$^+$ polysilicon. An anode contact 533 may be provided on the polysilicon layer 540 and a cathode contact 537 may be provided on the substrate 510 to complete the Schottky diode of FIG. 5. The presence of the polysilicon layer 540 in FIG. 5 may provide improved characteristics of the Schottky diode as discussed above with respect to the hybrid semiconductor device.

Referring now to FIG. 6, a cross section of a junction barrier Schottky (JBS) diode will be discussed. The JBS diode of FIG. 6 is very similar to the diode illustrated in FIG. 5, except a plurality of junctions are provided in the SiC drift layer 614. These junctions are provided to provide devices exhibiting relatively lower leakage currents. The presence of the polysilicon layer 640 in FIG. 6 may provide improved characteristics of the Schottky diode as discussed above with respect to the hybrid semiconductor device.

As discussed above, embodiments of the present invention are not limited to the use of SiC. Different materials may be used without departing from the scope of the present invention. Referring to FIG. 7, a layer including gallium nitride (GaN) 713, for example, aluminum gallium nitride (AlGaN), may be provided on a GaN substrate 711. A passivation layer 780 may be provided on the layer including GaN 713 and an opening may be defined therein exposing a surface of the layer including GaN 713. A polysilicon layer 740, for example, N$^+$ polysilicon, may be provided in the opening such that the polysilicon layer 740 is provided on the exposed portion of the layer including GaN 713 and the passivation layer 780. An anode contact 733 is provided on the polysilicon layer 740 and a cathode contact is provided on the layer including GaN 413 to complete the Schottky diode. The presence of the polysilicon layer 740 in FIG. 7 may provide improved characteristics of the Schottky diode as discussed above with respect to the hybrid semiconductor device.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A hybrid semiconductor device, comprising:
a silicon carbide (SiC) semiconductor substrate;
a PIN diode portion on the semiconductor substrate, the PIN diode portion having an anode contact on a first surface of the semiconductor substrate;
a Schottky diode portion on the semiconductor substrate, the Schottky diode portion including a polysilicon layer on the semiconductor substrate and an ohmic contact on the polysilicon layer, the ohmic contact being different and spaced apart from the anode contact;
a SiC layer on the SiC substrate; and
a P-type SiC layer on the SiC layer, the SiC layer and the P-type SiC layer defining a trench that extends through the P-type SiC layer and exposes the SiC layer,
wherein the polysilicon layer is on the exposed portion of the SiC layer, the ohmic contact is on the polysilicon layer and wherein the anode contact of the PIN diode portion is on the P-type SiC layer.

2. The hybrid semiconductor device of claim 1, wherein the SiC substrate comprises a semi-insulating SiC substrate.

3. The hybrid semiconductor device of claim 1, wherein the polysilicon layer comprises an N-type polysilicon.

4. The hybrid semiconductor device of claim 1, wherein the SiC layer comprises an insulating SiC layer.

5. The hybrid semiconductor device of claim 1, wherein the anode contact of the PIN diode portion comprises an ohmic contact including aluminum, titanium and/or nickel.

6. The hybrid semiconductor device of claim 1, wherein the trench comprises a first trench, the device further comprising:
an N-type SiC layer on the SiC substrate between the SiC substrate and the SiC layer, the SiC layer and the N-type SiC layer defining a second trench that extends through the SiC layer and exposes the N-type SiC layer; and
an ohmic contact on the exposed portion of the N-type SiC layer.

7. The hybrid semiconductor device of claim 1 wherein the device has barrier height of less than about 0.8 eV to about 0.3 eV.

8. The hybrid semiconductor device of claim 1 wherein the device is stable at operating temperatures up to about 250° C.

9. A method of forming a hybrid semiconductor device, comprising:
providing a PIN diode portion on a silicon carbide (SiC) semiconductor substrate, the PIN diode portion having an anode contact on a first surface of the semiconductor substrate;
providing a Schottky diode portion on the semiconductor substrate, the Schottky diode portion including a polysilicon layer on the semiconductor substrate and an ohmic contact on the polysilicon layer, the ohmic contact being different than and spaced apart from the anode contact;
providing a SiC layer on the SiC substrate;
providing a P-type SiC layer on the SiC layer;
etching a trench in the SiC layer and the P-type SiC layer that extends through the P-type SiC layer and exposes the SiC layer;
providing the polysilicon layer on the exposed portion of the SiC layer; and
providing the Ohmic contact on the polysilicon layer, wherein the anode contact of the PIN diode portion is formed on the P-type SiC layer.

10. The method of claim 9, wherein the SiC substrate comprises a semi-insulating SiC substrate.

11. The method of claim 9, wherein forming the polysilicon layer comprises forming an N-type polysilicon layer using chemical vapor deposition (CVD).

12. The method of claim 9, wherein the providing the SiC layer comprises forming an insulating SiC layer.

13. The method of claim 9, wherein the anode contact of the PIN diode portion comprises an ohmic contact including aluminum, titanium and/or nickel.

14. The method of claim 9, wherein providing the trench comprises providing a first trench and wherein providing the SiC layer is preceded by providing an N-type SiC layer on the SiC substrate, the method further comprising:

etching the SiC layer and the N-type SiC layer to provide a second trench that extends through the SiC layer and exposes the N-type SiC layer; and providing an ohmic contact on the exposed portion of the N-type SiC layer.

15. The method of claim 9, wherein the device has barrier height of less than about 0.8 eV to about 0.3 eV.

16. The method of claim 9, wherein the device is stable at operating temperatures up to about 250° C.

* * * * *

UNITED STATES PATENT AND TRADEMARK OFFICE
CERTIFICATE OF CORRECTION

PATENT NO. : 8,304,783 B2
APPLICATION NO. : 12/477376
DATED : November 6, 2012
INVENTOR(S) : Sriram et al.

It is certified that error appears in the above-identified patent and that said Letters Patent is hereby corrected as shown below:

In the Specification

Column 5, Line 31: Please replace "signals on sic." To read -- signals on SiC. --

Signed and Sealed this
Sixteenth Day of July, 2013

Teresa Stanek Rea
*Acting Director of the United States Patent and Trademark Office*